United States Patent
Allen, Jr.

(10) Patent No.: US 8,779,752 B2
(45) Date of Patent: Jul. 15, 2014

(54) PASS THROUGH DEVICE FOR NON-CONTACT VOLTAGE DETECTORS

(75) Inventor: Philip Brown Allen, Jr., Bettendorf, IA (US)

(73) Assignee: Grace Engineered Products, Inc., Davenport, IA (US)

( * ) Notice: Subject to any disclaimer, the term of this patent is extended or adjusted under 35 U.S.C. 154(b) by 498 days.

(21) Appl. No.: 13/298,669

(22) Filed: Nov. 17, 2011

(65) Prior Publication Data

US 2013/0127440 A1     May 23, 2013

(51) Int. Cl.
*G01R 19/00* (2006.01)
*G01R 31/302* (2006.01)
*G01R 15/16* (2006.01)
*G01R 19/155* (2006.01)

(52) U.S. Cl.
CPC ............ *G01R 15/16* (2013.01); *G01R 19/0084* (2013.01); *G01R 31/302* (2013.01); *G01R 19/155* (2013.01)
USPC .................................. 324/76.11; 324/754.21

(58) Field of Classification Search
USPC ................. 324/76.11, 508, 537, 500, 754.01, 324/754.21
See application file for complete search history.

(56) References Cited

U.S. PATENT DOCUMENTS

| 6,917,174 B2 * | 7/2005 | Carruthers et al. ........... 318/450 |
| 2009/0033336 A1 * | 2/2009 | Blanchard ..................... 324/537 |

* cited by examiner

*Primary Examiner* — Hoai-An D Nguyen
(74) *Attorney, Agent, or Firm* — McKee, Voorhees & Sease

(57) ABSTRACT

A device for allowing an electrical worker to use a non-contact voltage detector to check for the presence or absence of voltage inside a closed electrical panel is provided. The device includes an assembly having a front side and an opposite back side, a plurality of posts extending outwardly from the back side of and configured to hold wires in a fixed position within the closed electrical panel, and a plurality of indentations in the front side which form protrusions on the back side and are positioned to allow for positioning the non-contact voltage detector proximate the wires for testing with the non-contact voltage detector.

20 Claims, 5 Drawing Sheets

PASS THROUGH DEVICE FOR NON-CONTACT VOLTAGE DETECTORS

FIELD OF THE INVENTION

The present invention relates to non-contact voltage detection. More specifically, but not exclusively, the present invention relates to a device for allowing electrical workers using a non-contact voltage detector (NCVD) to check for the presence or absence of voltage inside a closed electrical panel.

BACKGROUND OF THE INVENTION

Non-contact voltage detectors (NCVD) typically in the form of a test pen are a well-known means for determining the absence or presence of voltage. In a NCVD instead of direct contact with a circuit, changes in an electric field associated with the presence of an AC voltage are detected capacitively.

Industrial and commercial facilities typically have electrical panels providing access to line voltages. The electrical panels remain closed except when access is needed by maintenance personnel. When maintenance personnel open the electrical panels there is the risk of electrical accidents causing injury or death. Various safety measures can be taken and protocols followed to reduce the risk of electrical accidents but these measures may not always be taken and protocols followed due to the reduction in productivity associated with doing so. When these measures are taken and protocols are followed there may be a reduction in productivity.

What is needed is a way to allow for non-contact voltage detection without opening an electrical enclosure.

SUMMARY OF THE INVENTION

Therefore, it is a primary object, feature, or advantage of the present invention to improve over the state of the art.

It is a further object, feature, or advantage of the present invention to prevent electrical accidents.

Yet another object, feature, or advantage of the present invention is to check for the presence or absence of voltage inside a closed electrical panel One or more of these and/or other objects, features, or advantages will be apparent from the specification and claims that follow. No single embodiment need exhibit each and every object, feature, or advantage.

According to one aspect of the present invention, a device for allowing an electrical worker to use a non-contact voltage detector to check for the presence or absence of voltage inside a closed electrical panel is provided. The device includes an assembly having a front side and an opposite back side, a plurality of posts extending outwardly from the back side of and configured to hold wires in a fixed position within the closed electrical panel, and a plurality of indentations in the front side which form protrusions on the back side and are positioned to allow for positioning the non-contact voltage detector proximate the wires for testing with the non-contact voltage detector.

According to another aspect of the present invention, a device for allowing an electrical worker to use a non-contact voltage detector to check for the presence or absence of voltage inside a closed electrical panel is provided. The device includes a plastic assembly having a front side and an opposite back side, a plurality of posts extending outwardly from the back side of and configured to hold a wire in a fixed position within the closed electrical panel, and an indentation in the front side which forms a protrusion on the back side and is positioned to allow for positioning the non-contact voltage detector proximate the wire for testing with the non-contact voltage detector.

According to another aspect of the present invention, a method for checking for the presence of absence of voltage inside a closed electrical panel using a non-contact voltage detector is provided. The method includes installing a pass-through device in the electrical panel, the pass-through device includes an assembly having a front side and an opposite back side, a plurality of posts extending outwardly from the back side of and configured to hold a wire in a fixed position within the closed electrical panel and an indentation in the front side which forms a protrusion on the back side and is positioned to allow for positioning the non-contact voltage detector proximate the wire for testing with the non-contact voltage detector. The method further includes inserting a probe of the non-contact voltage detector into the indentation and determining whether or not voltage is present on the wire using the non-contact voltage detector.

DETAILED DESCRIPTION

Figure 1:
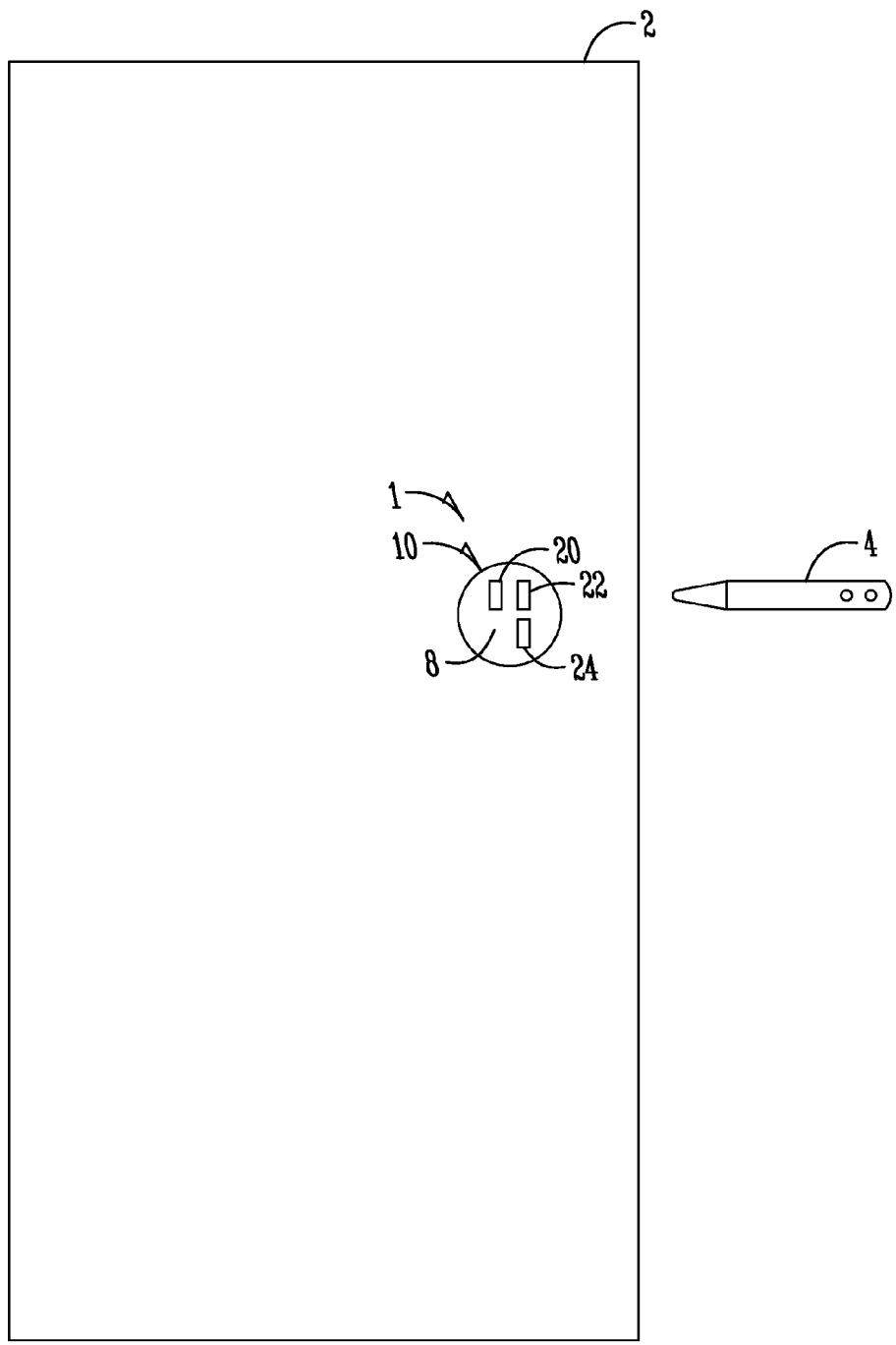
FIG. 1 illustrates a pass through device installed in an electrical enclosure and ready for testing performed with a non-contact voltage detector.

FIG. 1 illustrates one embodiment of the pass through device 1 as used in a particular environment. The device 1 allows workers using non-contact voltage detectors 4 to check for the presence or absence of voltage inside a closed electrical panel 2. The pass through device 1 positions one or more electrical conductors close enough to the outside of the electrical panel 2 so that a non-contact voltage detector 4 can sense enough electrical energy from the energized conductor(s) to indicate the presence or absence of voltage. Thus, in this manner when AC voltage is present on a wire within the cabinet, a worker can receive an indication that voltage is present without opening the electrical panel 2 and without coming into contact with the energized conductor(s) present within the electrical panel 2. Because the electrical panel 2 need not be opened there is a significant potential savings in productivity of the worker because the worker does not need to go through the time-consuming safety procedures which should be followed if the electrical panel 2 is opened.

Figure 2:
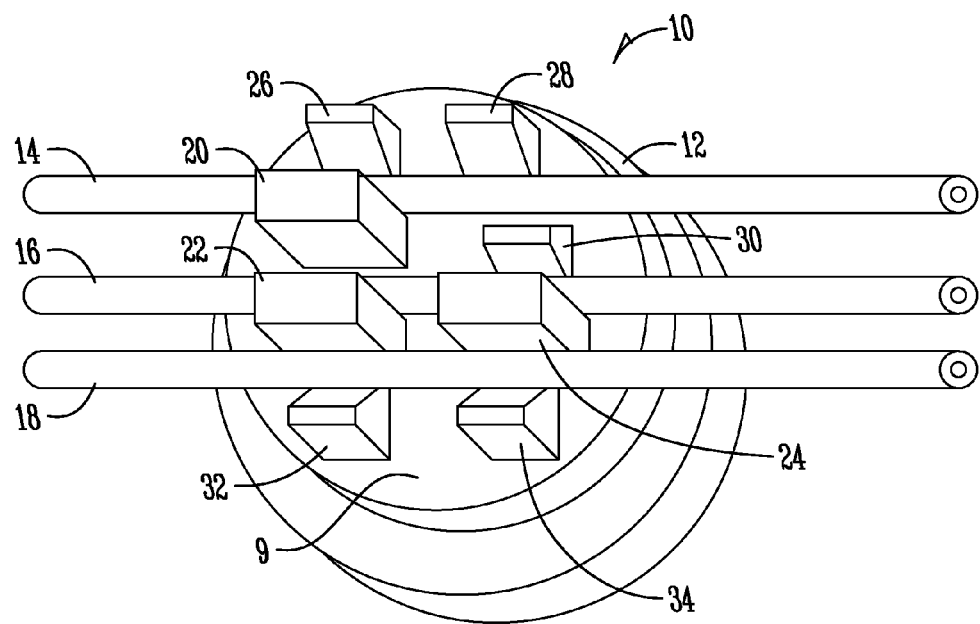
FIG. 2 illustrates a back side of an assembly of the pass through device.
Figure 4:
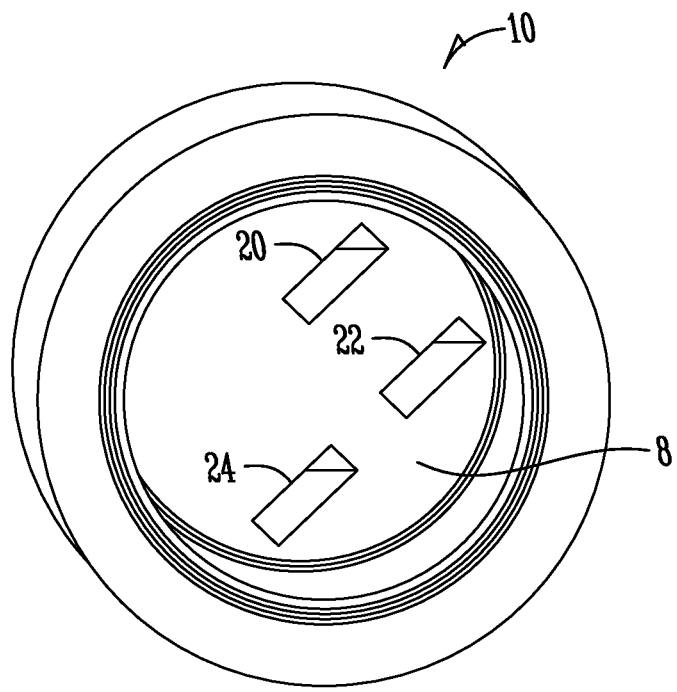
FIG. 4 illustrates a front side of an assembly of the pass through device.

The device 1 has an assembly 10 which has a front side 8 shown which includes a plurality of indentations 20, 22, 24 (see also FIG. 4). The assembly 10 may be formed of plastic or other non-metallic material. As shown in FIG. 2, the assembly 10 also has a back side 9 with a circular surface. Although a single part assembly 10 is shown, the present invention contemplates that the assembly may alternatively be a two or more part assembly. The assembly 10 allows the voltage on three wires (preferably 18-14 AWG) to be checked with a non-contact voltage detector to see if there is hazardous voltage on any of the three wires 14, 16, 18. The assembly 10 does this by making sure the wires 14, 16, 18 are at the correct distance so a non-contact voltage detector can be inserted into the front of the device to verify the presence of voltage in the wire.

The back side 9 of the assembly 10 has posts 26, 28, 30, 32, 34. In addition, the indentations from the front of the assembly 10 become protrusions 20, 22, 24 from the back side 9. The posts 26, 28, 30, 32, 34 align the wires 14, 16, 18 in the correct location to make sure each wire 14, 16, 18 is at a correct distance from the protrusions 20, 22, 24. Thus, when an electrical worker inserts a non-contact voltage pen into one of the indentations 20, 22, 24, the probe tip of the non-contact voltage pen is positioned properly at a correct distance from the corresponding wire 20, 22, 24. Note that as shown, the back side 9 has a circular surface. The protrusions 20, 22, 24 are generally rectangular. The posts as shown are wedge-shaped.

Figure 3:
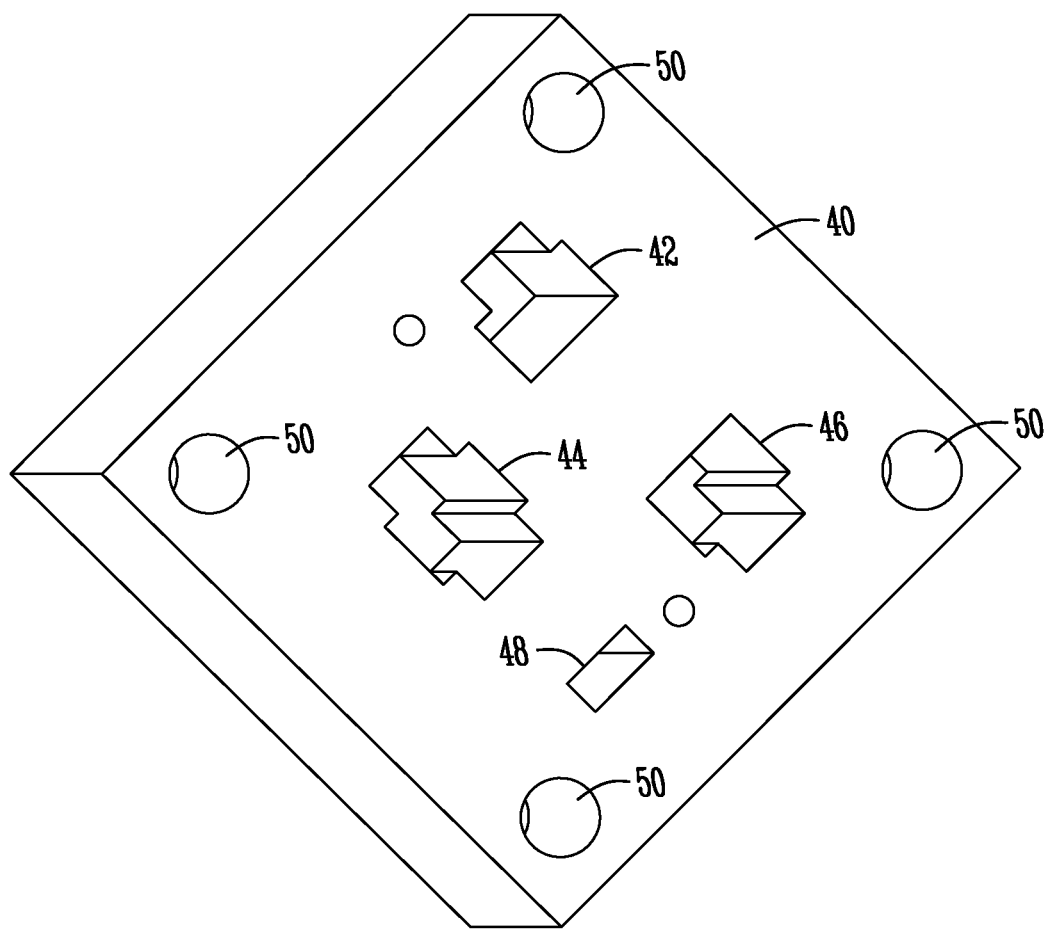
FIG. 3 illustrates a mounting plate of the pass through device.

FIG. 3 illustrates a mounting plate 40. The mounting plate 40 has a plurality of holes 42, 44, 46, 48 configured to mate with the posts and/or protrusions of the back side of the assembly 10. The mounting plate 40 also has apertures 50 which can, for example, accept screws for securing mounting the device 1 to the electrical panel.

FIG. 4 illustrates the front side 8 of the assembly 10 with the indentations 20, 22, 24. As previously explained, a probe tip of a non-contact voltage detector may be inserted into the indentations 20, 22, 24 in order to detect if voltage is present in the wires corresponding to these indentations 20, 22, 24. The front side 8 has a generally circular surface. The assembly 10 can be installed in an electrical panel by boring a hole through the cover of the electrical panel (such as with a drill) and then inserting the assembly 10 in place.

Figure 5:
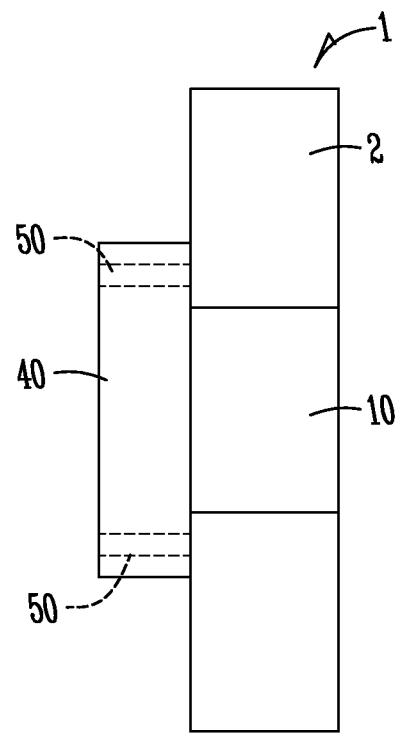
FIG. 5 is a sectional view of the pass through device mounted to the electrical enclosure.

FIG. 5 illustrates a profile of the device 1 showing the assembly 10 mounted in a panel of an electrical enclosure 2 with the mounting plate 40 securing the device 1 to the electrical enclosure.

Although a particular embodiment is described, the present invention contemplates other variations, options, and alternatives. For example, instead of accommodating a plurality of wires a single wire version may be used for larger gauge wire (such as #12 AWG+). In addition, to accommodate larger gage wires or for other reasons, the assembly may be a two-part assembly with a first part mounted to the enclosure sub-panel built to provide a mounting surface and stability for larger conductors. The second part would then mount to the outside of the enclosure and provide correct positioning for the non-contact voltage detectors to properly sense the electrical energy.

Therefore a device for allowing an electrical worker to use a non-contact voltage detector to check for the presence or absence of voltage inside a closed electrical panel has been provided. The present invention contemplates various changes in size, shape, structure, number of parts, configuration, type of materials, and other variations.

What is claimed is:

1. A device for allowing an electrical worker to use a non-contact voltage detector to check for the presence or absence of voltage inside a closed electrical panel, the device comprising:
    an assembly having a front side and an opposite back side;
    a plurality of posts extending outwardly from the back side of and configured to hold wires in a fixed position within the closed electrical panel;
    a plurality of indentations in the front side which form protrusions on the back side and are positioned to allow for positioning the non-contact voltage detector proximate the wires for testing with the non-contact voltage detector.

2. The device of claim 1 further comprising a mounting plate having a plurality of holes configured to mate with the posts of the backside and the protrusions, the mounting plate configured to secure the assembly to the electrical panel.

3. The device of claim 2 wherein the plurality of wires comprises three wires and the plurality of indentations comprise three indentations with each of the three indentations corresponding to one of the three wires.

4. The device of claim 3 wherein the front side is circular.

5. The device of claim 4 wherein the back side is circular.

6. The device of claim 5 wherein the front side has a surface area greater than the back side.

7. The device of claim 6 wherein each of the plurality of posts is wedge-shaped.

8. The device of claim 7 wherein each of the protrusions is rectangular.

9. The device of claim 8 wherein the assembly is a single piece assembly.

10. The device of claim 9 wherein the assembly comprises plastic.

11. A device for allowing an electrical worker to use a non-contact voltage detector to check for the presence or absence of voltage inside a closed electrical panel, the device comprising:
    a plastic assembly having a front side and an opposite back side;
    a plurality of posts extending outwardly from the back side of and configured to hold a wire in a fixed position within the closed electrical panel;
    an indentation in the front side which forms a protrusion on the back side and is positioned to allow for positioning the non-contact voltage detector proximate the wire for testing with the non-contact voltage detector.

12. The device of claim 11 further comprising a mounting plate having a plurality of holes configured to mate with the posts of the back side and the protrusion, the mounting plate configured to secure the assembly to the electrical panel.

13. The device of claim 12 wherein the front side is circular.

14. The device of claim 13 wherein the back side is circular.

15. The device of claim 14 wherein the front side has a surface area greater than the back side.

16. The device of claim 15 wherein each of the plurality of posts is wedge-shaped.

17. The device of claim 16 wherein each of the protrusions is rectangular.

18. The device of claim 17 wherein the assembly is a single piece assembly.

19. The device of claim 18 wherein the assembly comprises plastic.

20. A method for checking for the presence of absence of voltage inside a closed electrical panel using a non-contact voltage detector, the method comprising:
    installing a pass-through device in the electrical panel, the pass-through device comprising an assembly having a front side and an opposite back side, a plurality of posts extending outwardly from the back side of and configured to hold a wire in a fixed position within the closed electrical panel and an indentation in the front side which forms a protrusion on the back side and is positioned to allow for positioning the non-contact voltage detector proximate the wire for testing with the non-contact voltage detector;
    inserting a probe of the non-contact voltage detector into the indentation; and determining whether or not voltage is present on the wire using the non-contact voltage detector.

* * * * *